(12) United States Patent
Matsubayashi et al.

(10) Patent No.: US 10,083,844 B2
(45) Date of Patent: Sep. 25, 2018

(54) METHOD OF MANUFACTURING BONDED BODY

(71) Applicant: SHINDENGEN ELECTRIC MANUFACTURING CO., LTD., Chiyoda-ku, Tokyo (JP)

(72) Inventors: Ryo Matsubayashi, Saitama (JP); Yuji Morinaga, Saitama (JP)

(73) Assignee: SHINDENGEN ELECTRIC MANUFACTURING CO., LTD., Tokyo (JP)

( * ) Notice: Subject to any disclaimer, the term of this patent is extended or adjusted under 35 U.S.C. 154(b) by 0 days.

(21) Appl. No.: 15/122,929

(22) PCT Filed: Mar. 31, 2015

(86) PCT No.: PCT/JP2015/060286
§ 371 (c)(1),
(2) Date: Sep. 1, 2016

(87) PCT Pub. No.: WO2016/157460
PCT Pub. Date: Oct. 6, 2016

(65) Prior Publication Data
US 2017/0103903 A1    Apr. 13, 2017

(51) Int. Cl.
*H01L 21/52* (2006.01)
*H01L 23/00* (2006.01)

(52) U.S. Cl.
CPC ............. *H01L 21/52* (2013.01); *H01L 24/75* (2013.01); *H01L 24/83* (2013.01); *H01L 2224/83203* (2013.01); *H01L 2224/83986* (2013.01)

(58) Field of Classification Search
None
See application file for complete search history.

(56) References Cited

U.S. PATENT DOCUMENTS 3,151,862 A    10/1964    Nicosia
3,376,808 A     4/1968    Beckett et al.
(Continued)

FOREIGN PATENT DOCUMENTS

JP    2010-114208 A    5/2010
JP    2012-9703 A      1/2012
JP    2015-56550 A     3/2015

OTHER PUBLICATIONS

International Search Report in PCT/JP2015/060297, dated Jun. 9, 2015.

(Continued)

*Primary Examiner* — Reema Patel
*Assistant Examiner* — Steven Christopher
(74) *Attorney, Agent, or Firm* — Hauptman Ham, LLP

(57) ABSTRACT

Provided is a method of manufacturing a bonded body having a structure where a substrate and an electronic part are bonded to each other with a metal particle paste interposed therebetween. The method includes an assembled body forming step where the electronic part is mounted on the substrate with the metal particle paste interposed therebetween, an assembled body arranging step of arranging the assembled body between two heating plates opposite to one another, and a bonding step of bonding the substrate and the electronic part to each other by heating while applying pressure to the assembled body by moving at least one of two heating plates to the other of two heating plates. The bonding step is performed under a condition that a temperature of the assembled body is within 0° C. to 150° C. In the bonding step, a metal particle paste minimally generates a sintering reaction.

5 Claims, 18 Drawing Sheets

(56) References Cited

U.S. PATENT DOCUMENTS

| | | | |
|---|---|---|---|
| 5,592,021 A | 1/1997 | Meschter et al. | |
| 2003/0000060 A1 | 1/2003 | Ichikawa et al. | |
| 2010/0024667 A1 | 2/2010 | Ikura | |
| 2010/0330776 A1 | 12/2010 | Zuniga et al. | |
| 2011/0049221 A1 | 3/2011 | Blais et al. | |
| 2012/0247664 A1* | 10/2012 | Kobayashi | H01L 24/75 156/285 |
| 2015/0115452 A1* | 4/2015 | Yoon | H01L 24/29 257/762 |
| 2015/0257280 A1* | 9/2015 | Ciliox | B05D 3/0254 228/122.1 |
| 2016/0126215 A1* | 5/2016 | Imbert | H01L 21/187 438/457 |

OTHER PUBLICATIONS

International Search Report in PCT/JP2015/060296, dated Jun. 9, 2015.
International Search Report in PCT/JP2015/060290, dated Jun. 9, 2015.
International Search Report in PCT/JP2015/060286, dated Jun. 9, 2015.
Engineering Toolbox (www.engineeringtoolbox.com) Aug. 1, 2017, 3pp.
Euro Inox Stainless Steel: Tables of Technical Properties, 2007, 24pp.
Office Action in U.S. Appl. No. 15/122,925, dated Sep. 29, 2017, 10pp.
Office Action in U.S. Appl. No. 15/122,926, dated Aug. 7, 2017, 18pp.
Office Action in U.S. Appl. No. 15/122,927, dated Sep. 22, 2017, 23pp.
Kaye and Laby http://www.kayelaby.npl.co.uk/general_physics/2_3/2_3_7.html May 22, 2017, 11pp.
Office Action in U.S. Appl. No. 15/122,925, dated Apr. 21, 2017.
Restriction Requirement in U.S. Appl. No. 15/122,926, dated May 26, 2017.
Restriction Requirement in U.S. Appl. No. 15/122,927, dated Apr. 11, 2017.
Notice of Allowance in U.S. Appl. No. 15/122,925, dated Dec. 28, 2017, 11pp.
Office Action in U.S. Appl. No. 15/122,926, dated Jan. 23, 2018, 18pp.
Office Action in U.S. Appl. No. 15/122,926, dated May 15, 2018, 11pp.

* cited by examiner

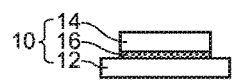 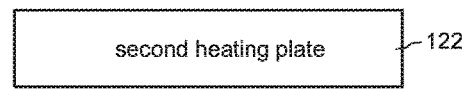 
FIG.1A    FIG.1B
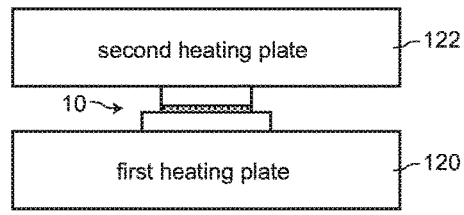 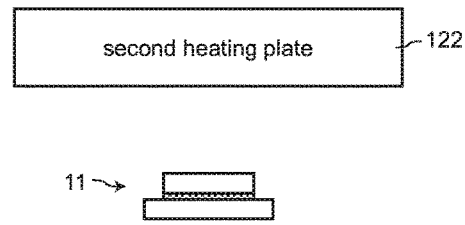 
FIG.1C    FIG.1D

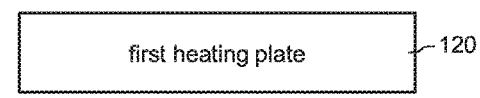
FIG.3A
FIG.3B
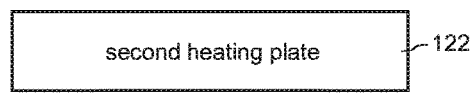
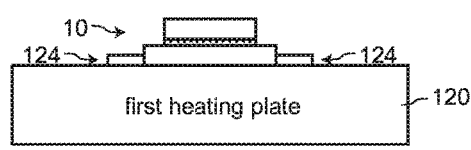
FIG.3C
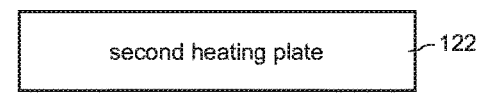
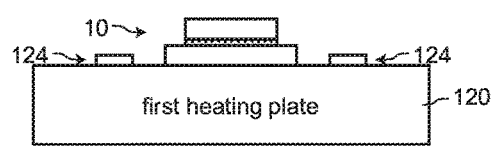
FIG.3D

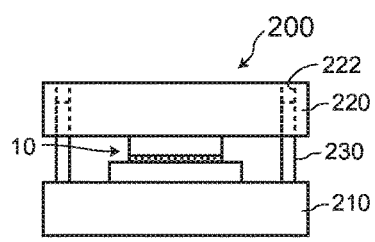
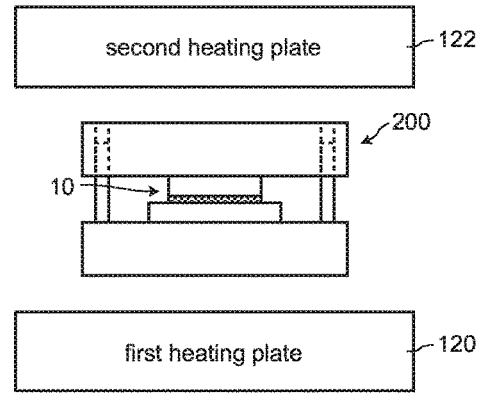
FIG.5A  FIG.5B
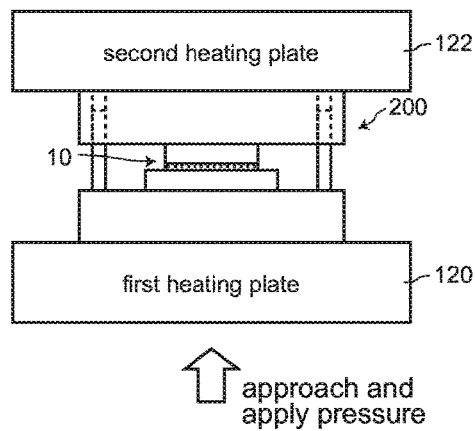
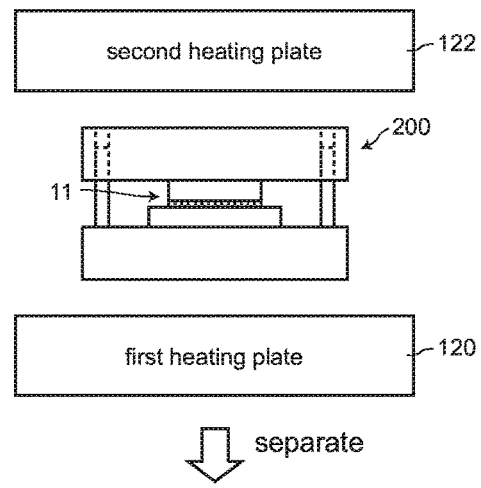
FIG.5C  FIG.5D

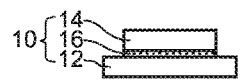
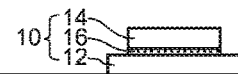
FIG.11A  FIG.11B
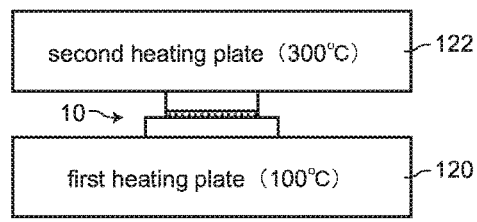
FIG.11C  FIG.11D

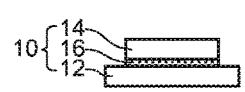
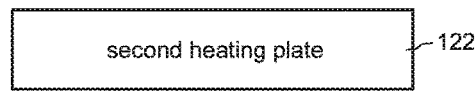
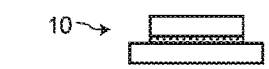
FIG.15A
FIG.15B
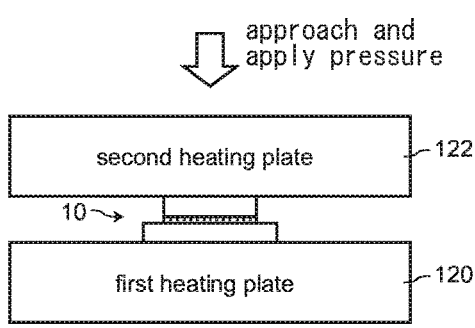
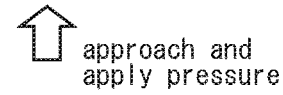
FIG.15C
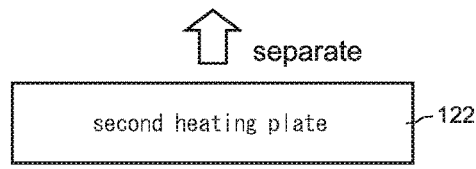
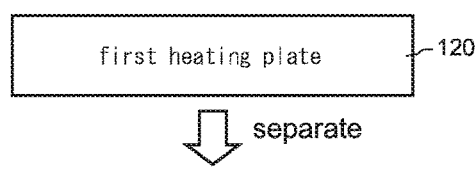
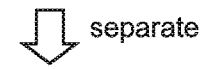
FIG.15D

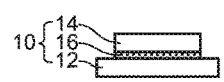
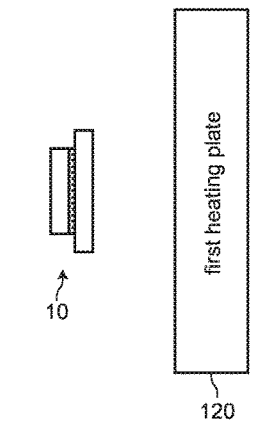
FIG.16A          FIG.16B
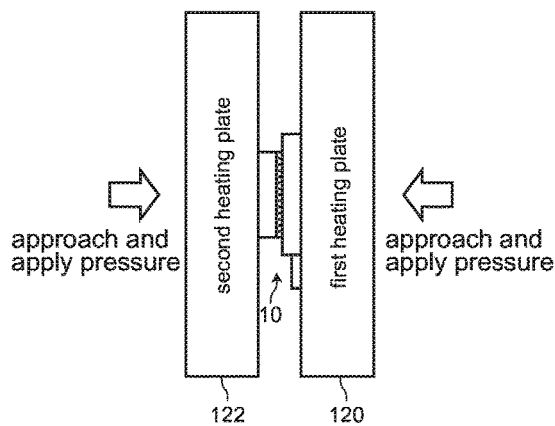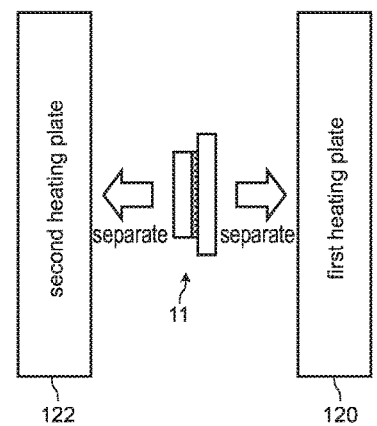
FIG.16C          FIG.16D

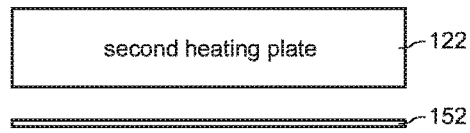
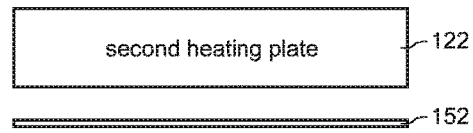
FIG.17A
FIG.17B
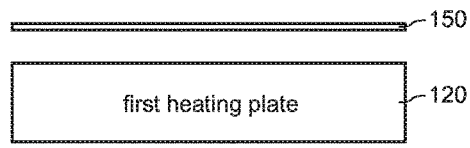
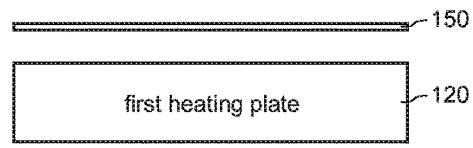
FIG.17C
FIG.17D

US 10,083,844 B2

METHOD OF MANUFACTURING BONDED BODY

RELATED APPLICATIONS

The present application is a National Stage of PCT International Application No. PCT/JP2015/060286, filed Mar. 31, 2015.

TECHNICAL FIELD

The present invention relates to a method of manufacturing a bonded body.

BACKGROUND ART

There has been known a semiconductor device having a structure where a substrate on which a conductor pattern is formed and a semiconductor element are bonded to each other using a metal particle paste (see patent literature 1, for example). The metal particle paste is a conductive paste of a low-temperature baking type which contains nano-sized or submicron-sized metal particles in a solvent, and makes use of a low-temperature sintering phenomenon and high surface activity of the metal particles.

As shown in FIG. 18, the above-mentioned semiconductor device can be manufactured by a following bonding step. An assembled body 10 where a semiconductor element 14 is mounted on a substrate 12 on which a conductor pattern is formed with a metal particle paste 16 interposed therebetween (see FIG. 18A) is placed on an upper surface of a first heating plate 920 on a lower side out of two heating plates (first heating plate 920 and second heating plate 922) (see FIG. 18B). The second heating plate 922 on an upper side is descended toward the first heating plate 920 thus heating the above-mentioned assembled body 10 while applying pressure to the assembled body 10 whereby the substrate 12 on which the conductor pattern is formed and the semiconductor element 14 are bonded to each other (see FIG. 18C and FIG. 18D).

CITATION LIST

Patent Literature

Patent Literature 1: JP-A-2012-9703

SUMMARY OF INVENTION

Technical Problem

However, in the above-mentioned method, heat is transferred to the metal particle paste 16 from the first heating plate 920 due to the heat transfer before pressure is applied to the assembled body 10 and hence, a sintering reaction (solidifying reaction) occurs in a portion of the metal particle paste 16. As a result, there arises a drawback that the substrate 12 on which a conductor pattern is formed and the semiconductor element 16 cannot be bonded to each other with a high bonding strength.

Such a problem is not a problem which occurs only in manufacturing a semiconductor device having the structure where a substrate on which a conductor pattern is formed and a semiconductor element are bonded to each other using a metal particle paste, and is also a problem which is likely to occur in bonded bodies in general having the structure where "a substrate on which a conductor pattern is formed or another substrate" and "a semiconductor element or another electronic part" are bonded to each other using a metal particle paste.

The present invention has been made to overcome the above-mentioned drawbacks, and it is an object of the present invention to provide a method of manufacturing a bonded body capable of bonding a substrate and an electronic part with a bonding strength higher than a bonding strength used in the prior art.

Solution to Problem

[1] A method of manufacturing a bonded body of the present invention is a method of manufacturing a bonded body having a structure where a substrate and an electronic part are bonded to each other with a metal particle paste interposed therebetween, the method including: an assembled body forming step of forming an assembled body where the electronic part is mounted on the substrate with the metal particle paste interposed therebetween; an assembled body arranging step of arranging the assembled body between two heating plates arranged in an opposedly facing manner; and a bonding step of bonding the substrate and the electronic part to each other by heating while applying pressure to the assembled body by moving at least one of two heating plates to the other of two heating plates, wherein the bonding step is performed under a condition that a temperature of the assembled body at the time of starting applying of the pressure to the assembled body by two heating plates falls within a range of from 0° C. to 150° C.

[2] In the method of manufacturing a bonded body of the present invention, it is preferable that the bonding step be performed under a condition that the temperature of the assembled body at the time of starting applying of the pressure to the assembled body by two heating plates falls within a range of from 50° C. to 135° C.

[3] In the method of manufacturing a bonded body of the present invention, it is preferable that, in the assembled body arranging step, the assembled body be arranged in a space defined between two heating plates at a position where the assembled body is in contact with neither one of two heating plates.

[4] In the method of manufacturing a bonded body of the present invention, it is preferable that the method of manufacturing a bonded body of the present invention further comprise, between the assembled body forming step and the assembled body arranging step, a pressure applying unit forming step for forming a pressure applying unit where the assembled body is sandwiched between two transfer members which transfer pressure and heat, and in the assembled body arranging step, the pressure applying unit be arranged in a space defined between two heating plates at a position where the pressure applying unit is in contact with neither one of two heating plates.

[5] In the method of manufacturing a bonded body of the present invention, it is preferable that a first heating plate out of two heating plates be set to a temperature which falls within a range of from 50° C. to 150° C., and a second heating plate out of two heating plates be set to a temperature which falls within a range of from 250° C. to 350° C., and in the assembled body arranging step, the assembled body be arranged at a position where the assembled body is in contact with the first heating plate.

[6] In the method of manufacturing a bonded body of the present invention, it is preferable that the method of manufacturing a bonded body of the present invention further comprise, between the assembled body forming step and the assembled body arranging step, a pressure applying unit forming step for forming a pressure applying unit where the assembled body is sandwiched between two transfer members which transfer pressure and heat, and in the assembled body arranging step, the pressure applying unit be arranged at a position where the pressure applying unit is in contact with either one of two heating plates.

[7] In the method of manufacturing a bonded body of the present invention, it is preferable that, in the assembled body arranging step, in a state where two heat shielding plates are arranged at a position in a space defined between two heating plates where two heat shielding plates are brought into contact with neither one of two heating plates, the assembled body be arranged in a space defined between two heat shielding plates at a position where the assembled body is in contact with neither one of two heat shielding plates, and in the bonding step, at least one of two heating plates be moved toward the other of two heating plates after two heat shielding plates are retracted from the space defined between two heating plates.

Advantageous Effects of Invention

According to the method of manufacturing a bonded body of the present invention, the bonding step is performed under a condition that a temperature of the assembled body at the time of starting applying of pressure to the assembled body (that is, at the time of starting the applying of pressure of the assembled body) by two heating plates falls within a range of from 0° C. to 150° C. Accordingly, in the bonding step, a sintering reaction (solidifying reaction) minimally occurs in a metal particle paste before pressure is applied to the assembled body. As a result, a substrate and an electronic part can be bonded to each other with a bonding strength higher than that of the prior art.

In the method of manufacturing a bonded body of the present invention, the reason that the bonding step is performed under a condition that a temperature of the assembled body at the time of starting the applying of pressure is 150° C. or below is as follows. That is, when the bonding step is performed under a condition that a temperature of the assembled body at the time of starting the applying of pressure is higher than 150° C., a sintering reaction is liable to occur in a metal particle paste before pressure is applied to the assembled body. As a result, there may be a case where bonding between a substrate and an electronic part with a bonding strength higher than that of the prior art becomes difficult. On the other hand, the reason that the bonding step is performed under a condition that a temperature of the assembled body at the time of starting the applying of pressure becomes 0° C. or above is as follows. That is, when the bonding step is performed under a condition that a temperature of the assembled body at the time of starting the applying of pressure is lower than 0° C., it takes a long time until the assembled body is heated to a temperature which enables bonding. As a result, it takes a long time for bonding a substrate and an electronic part to each other thus giving rise to a case where productivity at the time of performing a bonding step is lowered.

BRIEF DESCRIPTION OF DRAWINGS

FIG. 1A to FIG. 1D are views for explaining a method of manufacturing a bonded body according to an embodiment 1, wherein FIG. 1A to FIG. 1D are views showing respective steps.

FIG. 3A to FIG. 3D are views for explaining one example of the method of manufacturing the bonded body according to the embodiment 1, wherein FIG. 3A to FIG. 3D are views showing respective steps.

FIG. 4A to FIG. 4D are views for explaining one example of the method of manufacturing the bonded body according to the embodiment 1, wherein FIG. 4A to FIG. 4D are views showing respective steps.

FIG. 5A to FIG. 5D are views for explaining a method of manufacturing a bonded body according to an embodiment 2, wherein FIG. 5A to FIG. 5D are views showing respective steps.

FIG. 6A and FIG. 6B are views for explaining a pressure applying unit 200 and a tray 131 which can be used in the embodiment 2, wherein FIG. 6A is a cross-sectional view of the pressure applying unit 200, and FIG. 6B is a perspective view of the tray 131.

FIG. 7A to FIG. 7C are views for explaining one example of the method of manufacturing a bonded body according to the embodiment 2, wherein FIG. 7A to FIG. 7C are views showing the respective steps.

FIG. 8A to FIG. 8C are views for explaining one example of the method of manufacturing a bonded body according to the embodiment 2, wherein FIG. 8A to FIG. 8C are views showing the respective steps.

FIG. 9A to FIG. 9C are views for explaining one example of a method of manufacturing a bonded body according to the embodiment 2, wherein FIG. 9A to FIG. 9C are views showing respective steps.

FIG. 10A and FIG. 10B are views for explaining one example of a method of manufacturing a bonded body according to the embodiment 2, wherein FIG. 10A and FIG. 10B are views showing respective steps.

FIG. 11A to FIG. 11D are views for explaining a method of manufacturing a bonded body according to an embodiment 3, wherein FIG. 11A to FIG. 11D are views showing respective steps.

In FIG. 12, symbol $T_{RT}$ indicates a room temperature.

FIG. 13A to FIG. 13D are views for explaining a method of manufacturing a bonded body according to an embodiment 4, wherein FIG. 13A to FIG. 13D are views showing respective steps.

FIG. 14A to FIG. 14D are views for explaining a method of manufacturing a bonded body according to a modification 1, wherein FIG. 14A to FIG. 14D are views showing respective steps.

FIG. 15A to FIG. 15D are views for explaining a method of manufacturing a bonded body according to a modification 2, wherein FIG. 15A to FIG. 15D are views showing respective steps.

FIG. 16A to FIG. 16D are views for explaining a method of manufacturing a bonded body according to a modification 3, wherein FIG. 16A to FIG. 16D are views showing respective steps.

FIG. 17A to FIG. 17D are views for explaining a method of manufacturing a bonded body according to a modification 4, wherein FIG. 17A to FIG. 17D are views showing respective steps.

FIG. 18A to FIG. 18D are views for explaining a conventional method of manufacturing a bonded body, wherein FIG. 18A to FIG. 18D are views showing respective steps.

DESCRIPTION OF EMBODIMENTS

Figure 2:
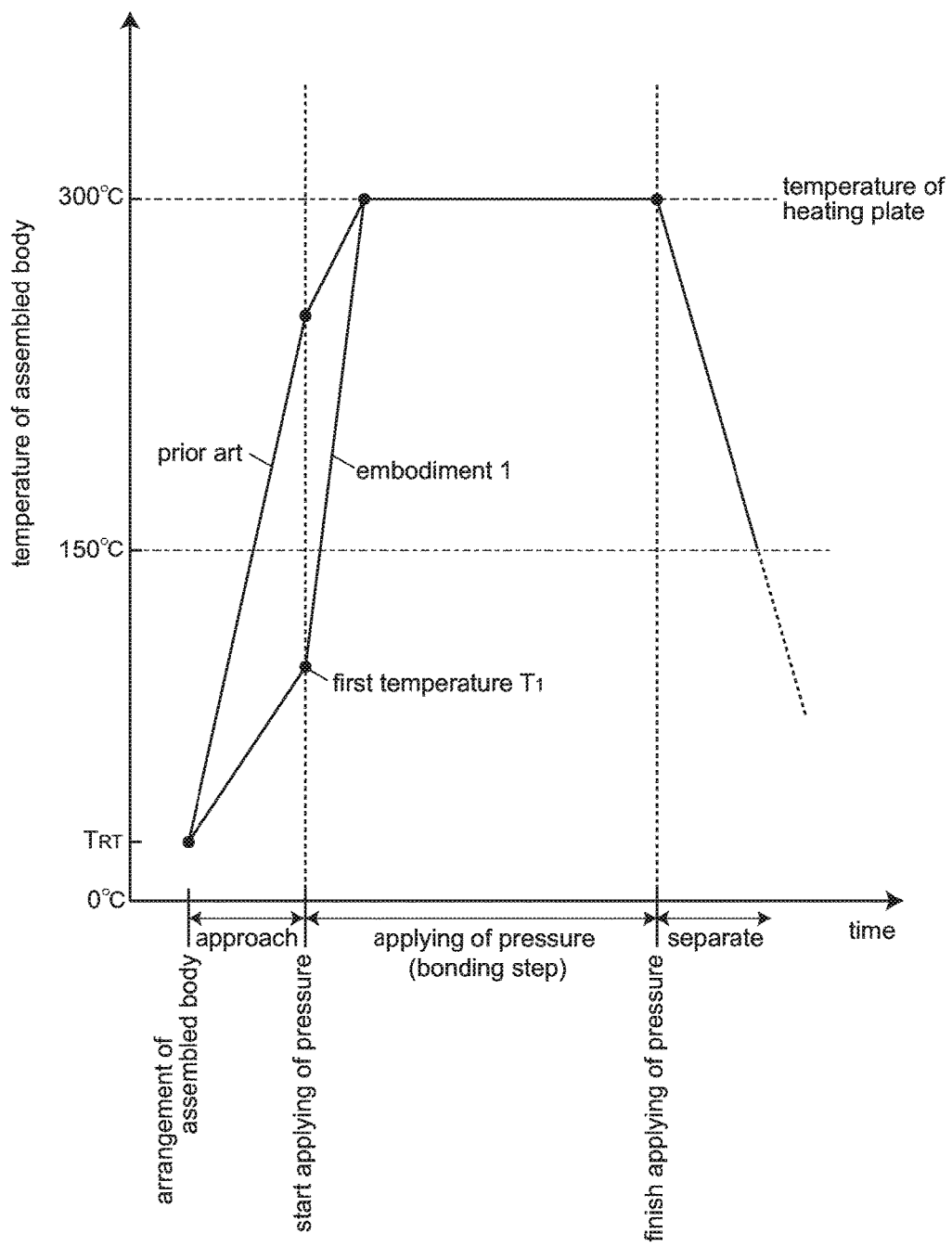
FIG. 2 is a view schematically showing a change in temperature of an assembled body according to the embodiment 1 and, in FIG. 2, symbol $T_{RT}$ indicates a room temperature.
Figure 4A:
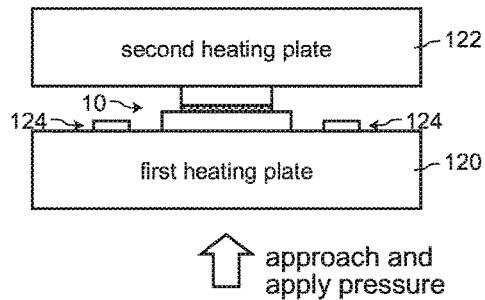
Figure 4B:
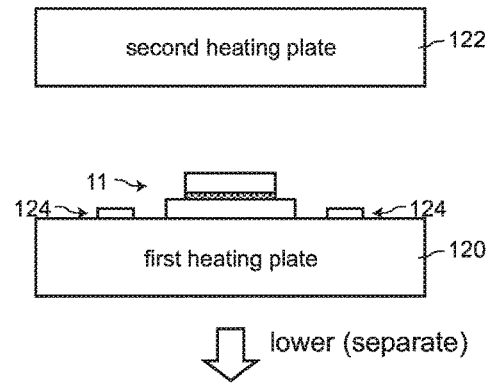
Figure 4C:
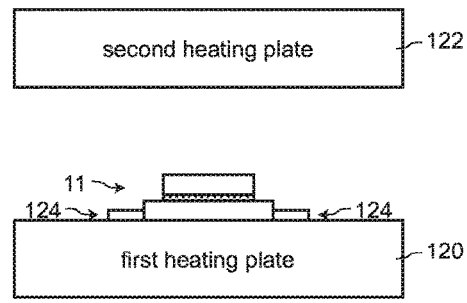
Figure 4D:
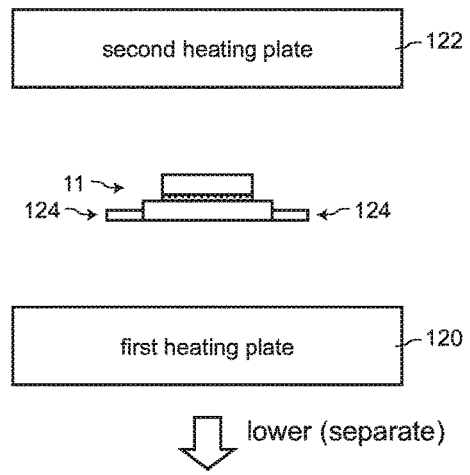

Hereinafter, a method of manufacturing a bonded body of the present invention is explained by reference to embodiments shown in the drawings.

Embodiment 1

As shown in FIG. 1, a method of manufacturing a bonded body according to an embodiment 1 is a method of manufacturing a bonded body for manufacturing a bonded body 11 (semiconductor device) having the structure where a substrate 12 (a substrate on which a conductor pattern is formed) and an electronic part 14 (semiconductor element) are bonded to each other with a metal particle paste 16 interposed therebetween (a method of manufacturing a semiconductor device).

The substrate 12, the electronic part 14, and the metal particle paste 16 are explained in detail.

In this specification, "substrate" means apart on which an electronic part is mounted.

The substrate 12 mounts the electronic part 14 thereon. The substrate 12 of the embodiment 1 is, for example, a printed circuit board where a conductor pattern is formed on a body made of a non-conductive material. As a material for forming the substrate 12, a material which has resistance to a sintering temperature of a metal particle paste 16 (for example, 300° C. although the sintering temperature depends on a kind of material) can be used. For example, a resin or a ceramic having heat resistance is used for forming the body, and metal is used for forming the conductor pattern.

The substrate to which the present invention is applicable may be a DCB (Direct Copper Bond) substrate or a lead frame. Further, it is sufficient that the substrate to which the present invention is applicable is a substrate on which an electronic part can be mounted. For example, the substrate may be a silicon chip. That is, the present invention is also applicable to the connection between a silicon chip and a conductive connector.

In this specification, "electronic part" means a part which is used in an electric product and is particularly required to be electrically connected to the substrate.

The electronic part 14 is a semiconductor element, for example.

As the electronic part 14, besides the above-mentioned semiconductor element (for example, a semiconductor chip on which an integrated circuit is mounted), an electric motor, a resistor, a capacitor, a piezoelectric element, a connector, a switch, an antenna, and a conductive connector can be exemplified. The method of manufacturing a bonded body of the present invention is particularly preferably applicable to a case where a bonded body formed by bonding at least one semiconductor element and a substrate to each other, that is, a semiconductor device is manufactured. Although the number of electronic parts 14 used in the embodiment 1 is one, the present invention is also applicable to the case where two or more electronic parts are used. When two or more electronic parts are used, the electronic parts may be formed of one kind of electronic part, or may be formed of plural kinds of electronic parts.

The metal particle paste 16 is a low-temperature baking-type conductive paste which makes use of low-temperature sintering phenomenon brought about by a quantum size effect of metal particles and high surface activity of the metal particles. The metal particle paste 16 contains metal particles, an organic dispersion material, an organic dispersion material capturing material, and a volatile organic solvent, for example. As the metal particles, metal particles formed of metal nanoparticles (for example, metal particles having an average diameter of approximately 100 nm or less), metal particles formed of metal submicron particles (for example, metal particles having an average diameter which falls within a range of from approximately 0.1 μm to approximately 1 μm), or metal particles formed of both the metal nanoparticles and the metal submicron particles can be used. As a material for forming metal particles, silver, gold or copper can be used, for example. The organic dispersion material covers surfaces of metal particles at a room temperature, and performs a function of holding metal particles in an independently dispersed state. The organic dispersion material capturing material reacts with the organic dispersion material which covers metal particles at a high temperature and performs a function of removing the organic dispersion material from a surface of the metal particle. The volatile organic solvent has a function of capturing a chemical reaction product formed between the organic dispersion material and the organic dispersion material capturing material and also performs a function of releasing the chemical reaction product to the outside of a system in the form of a gas.

The method of manufacturing a bonded body according to the embodiment 1 includes: an assembled body forming step of forming an assembled body 10 where the electronic part 14 is mounted on the substrate 12 with the metal particle paste 16 interposed therebetween (see FIG. 1A); an assembled body arranging step of arranging the assembled body 10 between two heating plates (a first heating plate 120, a second heating plate 122) arranged in an opposedly facing manner (see FIG. 1B); and a bonding step of bonding the substrate 12 and the electronic part 14 to each other by heating while applying pressure to the assembled body 10 by moving at least one (the first heating plate 120) of two heating plates (the first heating plate 120, the second heating plate 122) to the other (the second heating plate 122) of two heating plates (see FIG. 1C). FIG. 1D shows a state where two heating plates (the first heating plate 120, the second heating plate 122) are separated from each other by lowering the first heating plate 120 after the bonding step is finished, and a bonded body 11 can be taken out to the outside.

In the method of manufacturing a bonded body according to the embodiment 1, in the assembled body arranging step, the assembled body 10 is arranged in a space defined between two heating plates (the first heating plate 120, the second heating plate 122) at a position where the assembled body 10 is in contact with neither one of two heating plates (the first heating plate 120, the second heating plate 122) (see FIG. 1B) and hence, the bonding step is performed under a condition that a temperature $T_1$ (a first temperature $T_1$) of the assembled body at the time of starting applying of the pressure to the assembled body 10 (that is, at the time of starting the applying of pressure) by two heating plates (the first heating plate 120, the second heating plate 122) falls within a range of from 0° C. to 150° C. (see FIG. 2). A specific method of arranging the assembled body 10 in a space defined between two heating plates (the first heating plate 120, and the second heating plate 122) at a position where the assembled body 10 is in contact with neither one of two heating plates (the first heating plate 120, the second heating plate 122) in the assembled body arranging step is described later (see FIG. 3 and FIG. 4 described later).

According to the method of manufacturing a bonded body of the embodiment 1, in the assembled body arranging step, the assembled body 10 is arranged in a space defined between two heating plates (the first heating plate 120, the second heating plate 122) at a position where the assembled body 10 is in contact with neither one of two heating plates (the first heating plate 120, the second heating plate 122) (see FIG. 1B). Accordingly, the bonding step is performed under a condition that a temperature $T_1$ of the assembled body at the time of starting applying of pressure to the assembled body 10 (that is, at the time of starting the applying of pressure) by two heating plates (the first heating plate 120, the second heating plate 122) falls within a range of from 0° C. to 150° C. (see a curve of the embodiment 1 shown in FIG. 2). Accordingly, in the bonding step, a sintering reaction minimally occurs in a metal particle paste before pressure is applied to the assembled body. As a result, a substrate and an electronic part can be bonded to each other with a bonding strength higher than that of the prior art.

In the method of manufacturing a bonded body according to the embodiment 1, the reason that the bonding step is performed under a condition that a temperature $T_1$ of the assembled body at the time of starting the applying of pressure is 150° C. or below is as follows. That is, when the bonding step is performed under a condition that a temperature $T_1$ of the assembled body at the time of starting the applying of pressure is higher than 150° C. (see a curve of the prior art shown in FIG. 2), a sintering reaction is liable to occur in a metal particle paste before pressure is applied to the assembled body. As a result, there may be a case where bonding between a substrate and an electronic part with a bonding strength higher than that of the prior art becomes difficult. From this point of view, it is preferable to perform the bonding step under a condition that a temperature $T_1$ of the assembled body at the time of starting the applying of pressure is 135° C. or below, and it is more preferable to perform the bonding step under a condition that a temperature $T_1$ of the assembled body at the time of starting the applying of pressure is 120° C. or below.

On the other hand, the reason that the bonding step is performed under a condition that a temperature $T_1$ of the assembled body 10 at the time of starting the applying of pressure is 0° C. or above is as follows. That is, when the bonding step is performed under a condition that a temperature $T_1$ of the assembled body 10 at the time of starting the applying of pressure is lower than 0° C., it takes a long time until the assembled body is heated to a temperature which enables bonding. As a result, it takes a long time for bonding a substrate and an electronic part to each other thus giving rise to a case where productivity at the time of performing the bonding step is lowered. From this point of view, it is preferable to perform the bonding step under a condition that a temperature $T_1$ of the assembled body 10 at the time of starting the applying of pressure is 50° C. or above, and it is more preferable to perform the bonding step under a condition that a temperature $T_1$ of the assembled body 10 at the time of starting the applying of pressure is 75° C. or above.

A temperature $T_1$ of the assembled body 10 at the time of starting the applying of pressure can be confirmed by the measurement of a temperature using a thermography. As a temperature $T_1$ of the assembled body 10, it is preferable to use a temperature of the metal particle paste 16 sandwiched between the substrate 12 and the electronic part 14. However, for the sake of convenience, a temperature of the substrate 12, a temperature of the electronic part 14, or an average temperature of the assembled body 10 can be also used. Further, a temperature $T_1$ of the assembled body 10 can be confirmed also by the measurement of a temperature using a thermocouple. As a temperature $T_1$ of the assembled body 10, a temperature obtained by bringing a distal end portion of a thermocouple to any portion of the substrate 12 or the electronic part 14 and by converting an output voltage of the thermocouple into a temperature can be used. In this case, a temperature $T_1$ of the assembled body 10 is confirmed and, thereafter, the thermocouple is retracted and, then, the bonding step is performed so that the bonding between the substrate 12 and the electronic part can be properly performed. Further, a temperature elevation curve of the assembled body is measured in a preliminary examination performed prior to the bonding step, and an operation of arranging the assembled body and an operation of elevating the first heating plate properly over steps ranging from the assembled body arranging step to the bonding step by taking into account the temperature elevation curve, the substrate 12 and the electronic part can be properly bonded to each other.

One example of the method of manufacturing a bonded body according to the embodiment 1 is explained in detail by reference to FIG. 3 and FIG. 4.

1. Assembled Body Forming Step

Firstly, the assembled body 10 where the electronic part 14 is mounted on the substrate 12 with the metal particle paste 16 interposed therebetween is formed.

2. Assembled Body Arranging Step

Next, the assembled body 10 is held by an arm 124 (see FIG. 3A) and, thereafter, using the arm 124, the assembled body 10 is arranged between two heating plates (the first heating plate 120, the second heating plate 122) which are arranged to face each other in an opposed manner (see FIG. 3B).

3. Bonding Step

Next, the first heating plate 120 is elevated so as to bring the first heating plate 120 into contact with a lower surface of the assembled body 10 (see FIG. 3C) and thereafter, the arm 124 is removed from the assembled body 10 (see FIG. 3D). Then, the first heating plate 120 is further elevated with the assembled body 10 mounted on the first heating plate 120 thus bringing an upper surface of the assembled body 10 into contact with the second heating plate 122. Thereafter, the first heating plate 120 is further elevated (moved) toward the second heating plate 122 and hence, the assembled body 10 is heated while being applied with pressure at a predetermined pressure whereby the substrate 12 and the electronic part 14 are bonded to each other (see FIG. 4A).

Temperatures of both two heating plates (the first heating plate 120, the second heating plate 122) are set to 300° C., for example. Two heating plates (the first heating plate 120, the second heating plate 122) respectively have a flat plate shape, and surfaces of each heating plate opposite to each other are set parallel to each other. Although various kinds of materials can be used as a material for forming two heating plates (the first heating plate 120, the second heating plate 122), for example, stainless steel, die making steel or the like can be preferably used.

When the bonding step is finished, the first heating plate 120 is lowered (see FIG. 4B) so as to bring about a state where two heating plates (the first heating plate 120, the second heating plate 122) are separated from each other at a predetermined distance. Then, the bonded body 11 is held by the arm 124 (see FIG. 4C) and, thereafter, the first heating plate 120 is further lowered (see FIG. 4D) thus returning the first heating plate 120 to the initial position. At this stage of the operation, the bonded body 11 is held by the arm 124 and hence, the bonded body 11 can be taken out by the arm 124 to the outside from a space defined between the first heating plate 120 and the second heating plate 122.

Embodiment 2

A method of manufacturing a bonded body according to an embodiment 2 includes substantially the same steps as the method of manufacturing a bonded body according to the embodiment 1. However, the method of manufacturing a bonded body according to the embodiment 2 differs from the method of manufacturing a bonded body according to the embodiment 1 with respect to a point that a substrate and an electronic part are not bonded to each other by heating an assembled body while directly applying pressure to the assembled body using two heating plates but the substrate and the electronic part are bonded to each other by heating while indirectly applying pressure to the assembled body using a pressure applying unit. That is, as shown in FIG. 5, the method of manufacturing a bonded body according to the embodiment 2 is characterized in that the method further includes, between an assembled body forming step and an assembled body arranging step, a pressure applying unit forming step for forming a pressure applying unit 200 in a state where the assembled body is sandwiched between two transfer members (a first transfer member 210, a second transfer member 220) which transfer pressure and heat (see FIG. 5A), and in the assembled body arranging step (a pressure applying unit arranging step), the pressure applying unit 200 is arranged in a space defined between two heating plates (the first heating plate 120, the second heating plate 122) at a position where the pressure applying unit 200 is in contact with neither one of two heating plates (the first heating plate 120, the second heating plate 122) (see FIG. 5B).

In the method of manufacturing a bonded body according to the embodiment 2, after the assembled body arranging step is performed, a bonding step (see FIG. 5C) is performed where at least one (the first heating plate 120) of two heating plates (the first heating plate 120, the second heating plate 122) is moved toward the other (the second heating plate 122) of two heating plates so that the substrate 12 and the electronic part 14 are bonded to each other by heating the assembled body 10 while indirectly applying pressure to the assembled body 10 by means of the pressure applying unit 200 (see FIG. 5C). FIG. 5D shows a state where two heating plates (the first heating plate 120, the second heating plate 122) are separated from each other by lowering the first heating plate 120 after the bonding step is finished so that it is possible to takeout the pressure applying unit 200 and a bonded body 11 to the outside.

Further, in the method of manufacturing a bonded body according to the embodiment 2, in the assembled body arranging step, the pressure applying unit 200 is arranged in a space defined between two heating plates (the first heating plate 120, the second heating plate 122) at a position where the pressure applying unit 200 is in contact with neither one of two heating plates (the first heating plate 120, the second heating plate 122) (see FIG. 5B), and the bonding step is performed under a condition that a temperature $T_1$ of the assembled body at the time of starting applying of pressure to the assembled body 10 through the pressure applying unit 200 (that is, at the time of starting the applying of pressure) by two heating plates (the first heating plate 120, the second heating plate 122) falls within a range of from 0° C. to 150° C. In the assembled body arranging step, as a method of arranging the pressure applying unit 200 in a space defined between two heating plates (the first heating plate 120, the second heating plate 122) at a position where the pressure applying unit 200 is in contact with neither one of two heating plates (the first heating plate 120, the second heating plate 122), a method which uses an arm substantially in the same manner as the embodiment 1 can be used. However, a method described later can be also used (see FIG. 6 to FIG. 10 described later).

According to the method of manufacturing a bonded body of the embodiment 2, in the assembled body arranging step, the pressure applying unit 200 is arranged in a space defined between two heating plates (the first heating plate 120, the second heating plate 122) at a position where the pressure applying unit 200 is in contact with neither one of two heating plates (the first heating plate 120, the second heating plate 122) (see FIG. 5B) and hence, the bonding step is performed under a condition that a temperature $T_1$ of the assembled body at the time of starting applying of the pressure to the assembled body 10 (that is, at the time of starting the applying of pressure) by way of the pressure applying unit 200 by two heating plates (the first heating plate 120, the second heating plate 122) falls within a range of from 0° C. to 150° C. Accordingly, in the bonding step, a sintering reaction minimally occurs in a metal particle paste before pressure is applied to the assembled body. As a result, a substrate and an electronic part can be bonded to each other with a bonding strength higher than that of the prior art.

As has been explained in the embodiment 1, a temperature $T_1$ of the assembled body 10 at the time of starting the applying of pressure can also be confirmed by the measurement of a temperature using a thermography or can be confirmed by the measurement of a temperature using a thermocouple.

One example of a method of manufacturing a bonded body according to the embodiment 2 is explained in detail by reference to FIG. 6 to FIG. 10.

1. Assembled Body Forming Step

The assembled body 10 is formed substantially in the same manner as the embodiment 1.

2. Pressure Applying Unit Forming Step

Figure 6A:
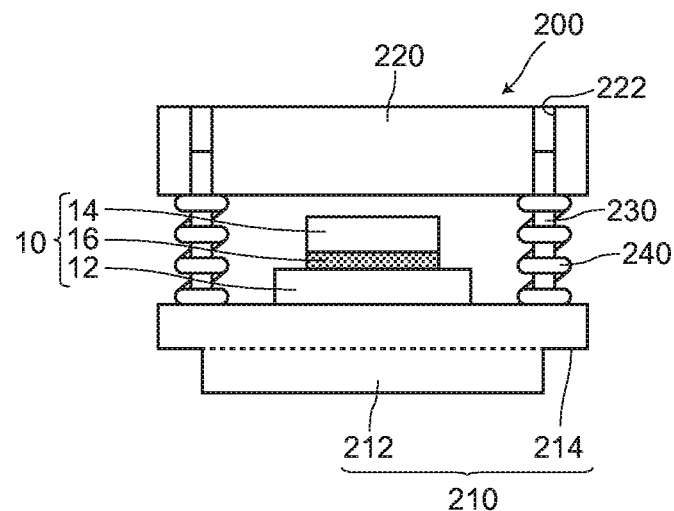

As shown in FIG. 6A, the pressure applying unit 200 includes a first transfer member 210, a second transfer member 220, guide members 230, and distance adjusting mechanisms 240. The pressure applying unit 200 sandwiches the assembled body 10 and transfers pressure and heat. The first transfer member 210 and the second transfer member 220 are connected to each other by way of the guide members 230.

The first transfer member 210 is a plate-like member on which the assembled body 10 is mounted. The first transfer member 210 includes: a base portion 212 which projects outward from a center portion of a surface of the first transfer member 210 on aside opposite to a surface of the first transfer member 210 which faces the second transfer member 220 in an opposed manner; and shoulder portions 214 which are formed on the periphery of the base portion 212. The first transfer member 210 has an approximately quadrangular shape as viewed in a plan view, and the guide member 230 is formed in an erected manner on respective corner portions of the first transfer member 210.

The second transfer member 220 is a flat-plate-like member which is brought into contact with the electronic part 14 when pressure is applied to the pressure applying unit. The second transfer member 220 has an approximately quadrangular shape as viewed in a plan view, and guide member receiving holes 222 are formed in the second transfer member 220 at positions corresponding to the guide members 230 (respective corner portions of the second transfer member 220).

The guide members 230 are rod-like members for connecting the first transfer member 210 and the second transfer member 220 to each other. The guide members 230 guide the second transfer member 220 while keeping parallelism of the second transfer member 220 with the first transfer member 210. One end portions of the guide members 230 are connected to the first transfer member 210 at respective corner portions of the first transfer member 210, and the other end portions of the guide members 230 are inserted into the guide member receiving holes 222 respectively. The other end portions of the guide members 230 are configured such that the other end portions of the guide members 230 do not project from the guide member receiving holes 222 even when pressure is applied to the pressure applying unit 200.

The distance adjusting mechanism 240 is a resilient member such as a coil spring for adjusting a distance between the first transfer member 210 and the second transfer member 220. The distance adjusting mechanisms 240 make the second transfer member 220 and the electronic part 14 separated from each other when pressure is not applied to the pressure applying unit 200, and brings the second transfer member 220 and the electronic part 14 into contact with each other when pressure is applied to the pressure applying unit 200.

Although various materials can be used as a material for forming two transfer members (the first transfer member 210, the second transfer member 220), metal (tool steel, stainless steel, carbon steel, a hard metal alloy or the like), ceramic (silicon nitride, aluminum nitride, boron nitride, zirconia, silicon carbide, alumina or the like) or the like may preferably be used, for example.

As can be understood from FIG. 5A and FIG. 6A, the pressure applying unit includes both the pressure applying unit where the assembled body is sandwiched between two transfer members without forming a gap between the transfer member and the assembled body and the pressure applying unit where the assembled body is sandwiched between two transfer members while forming a gap between the transfer member and the assembled body.

3. Pressure Applying Unit Arranging Step (Assembled Body Arranging Step)

Figure 6B:
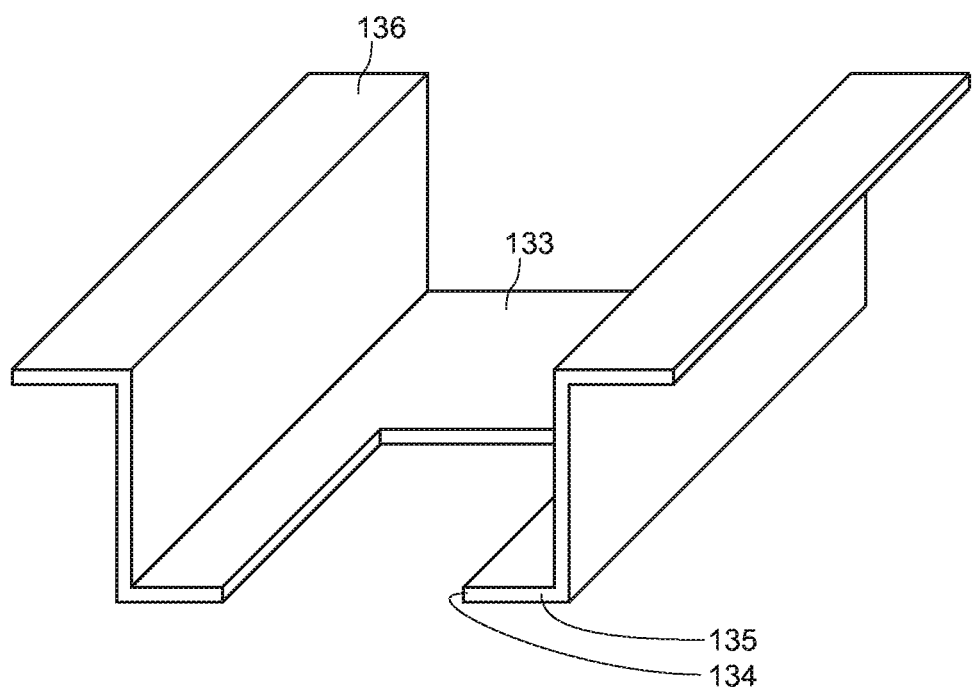
Figure 7A:
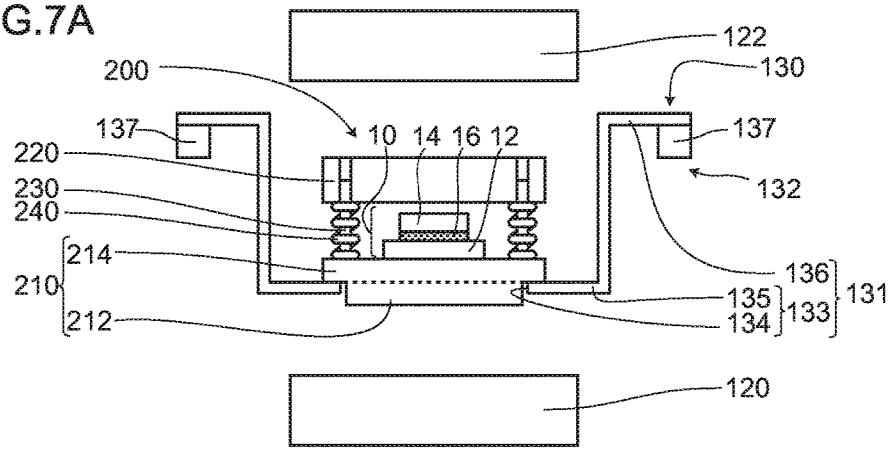
Figure 7B:
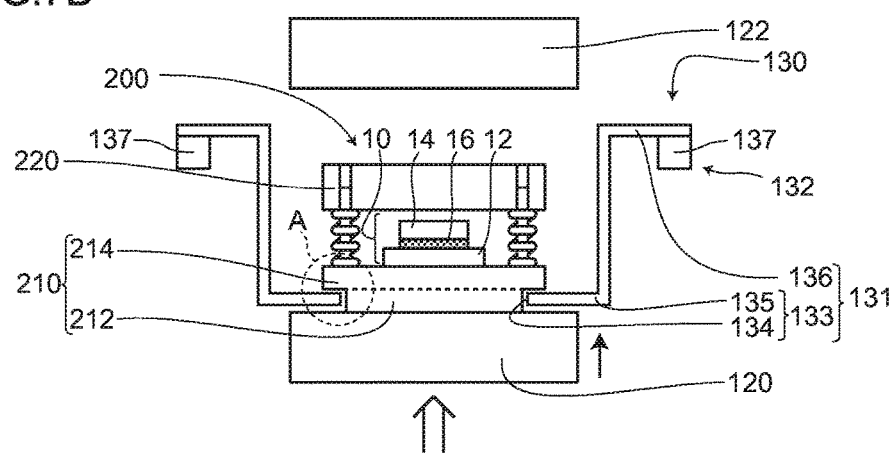
Figure 7C:
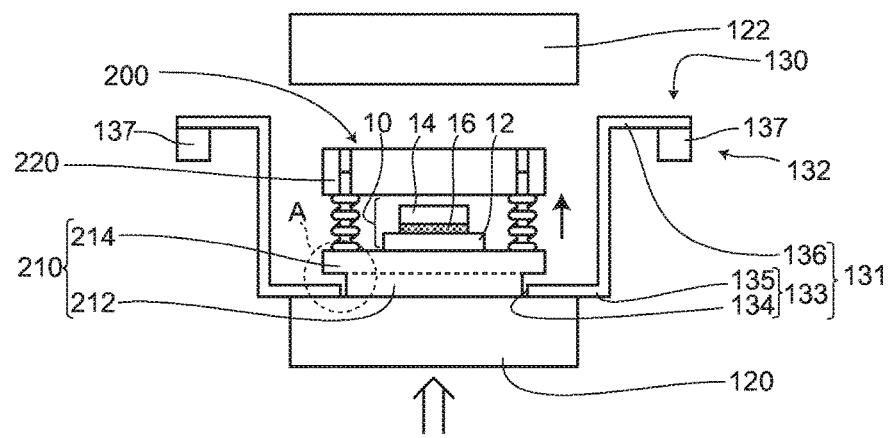

In the embodiment 2, the pressure applying unit arranging step is performed using a tray 131 (see FIG. 6B). Firstly, the base portion 212 of the first transfer member 210 is inserted into an opening portion 134 formed in the tray 131, and the pressure applying unit 200 is accommodated in the tray 131 in a state where the shoulder portions 214 of the first transfer member 210 are supported by support portions 135. Next, the tray 131 which accommodates the pressure applying unit 200 therein is mounted on tray receiving portions 137. Due to such an operation, the pressure applying unit 200 (and the assembled body 10) can be arranged in a space defined between the first heating plate 120 and the second heating plate 122 at a position where the pressure applying unit 200 is in contact with neither the first heating plate 120 nor the second heating plate 122 (see FIG. 7A). At this stage of the operation, the height position of the pressure applying unit 200 is an intermediate height position between the first heating plate 120 and the second heating plate 122.

4. Pressure Applying Unit Moving Step

Next, the first heating plate 120 is moved upward along an axis (along a vertical axis) extending toward the second heating plate 122 from the first heating plate 120 using a pressure applying mechanism portion not shown in the drawing.

The first heating plate 120 and the second heating plate 122 are heated in advance. Both a heating temperature of the first heating plate 120 and a heating temperature of the second heating plate 122 are 300° C., for example.

When the first heating plate 120 is moved to a position where the first heating plate 120 is in contact with the first transfer member 210, the first heating plate 120 is brought into a state where the first heating plate 120 pushes the base portion 212 of the pressure applying unit 200. Accordingly, a state is brought about where the support portions 135 of the tray 131 are separated from the shoulder portions 214 of the pressure applying unit 200 (see a region surrounded by a broken line A in FIG. 7B).

When the first heating plate 120 is further moved upward from such a state, the pressure applying unit 200 is also moved upward. Accordingly, a state is brought about where the tray 131 is in contact with the first heating plate 120 (see a region surrounded by a broken line A in FIG. 7C).

Figure 8A:
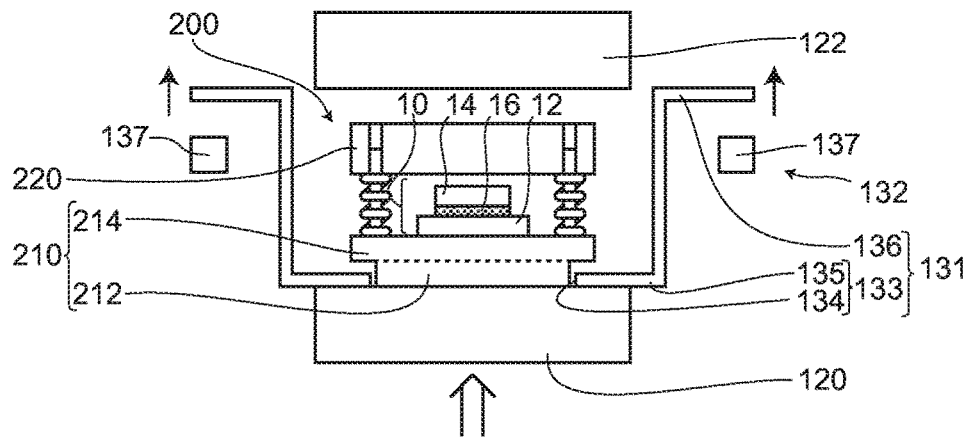

When the first heating plate 120 is further moved upward from such a state, the pressure applying unit 200 and the tray 131 are also moved upward, and a state is brought about where the tray 131 is separated from the tray receiving portions 137 (see FIG. 8A).

Figure 8B:
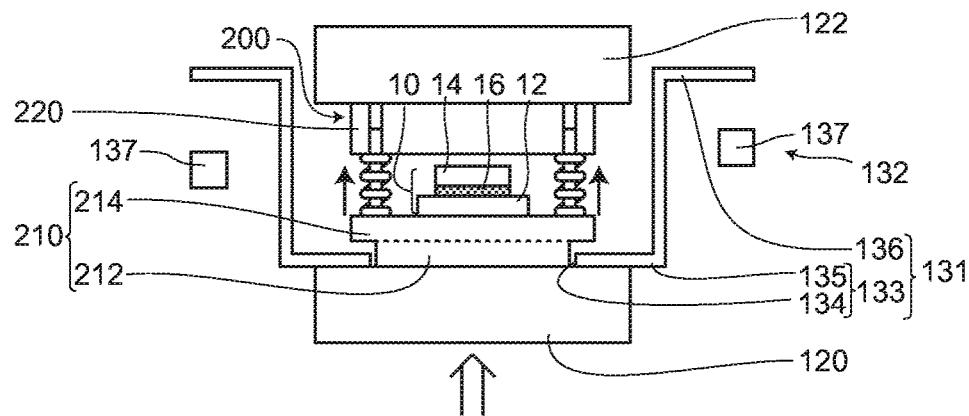

When the first heating plate 120 is further moved upward from such a state, the pressure applying unit 200 and the tray 131 are also moved upward, and a state is brought about where an upper surface of the second transfer member 220 of the assembled body 10 is in contact with the second heating plate 122 (see FIG. 8B). At this stage of the operation, heat is started to be transferred to the second transfer member 220 from the second heating plate 122 due to heat transfer. However, heat is not yet transferred to the assembled body 10.

5. Pressure Applying and Heating Step by Pressure Applying Unit

Figure 8C:
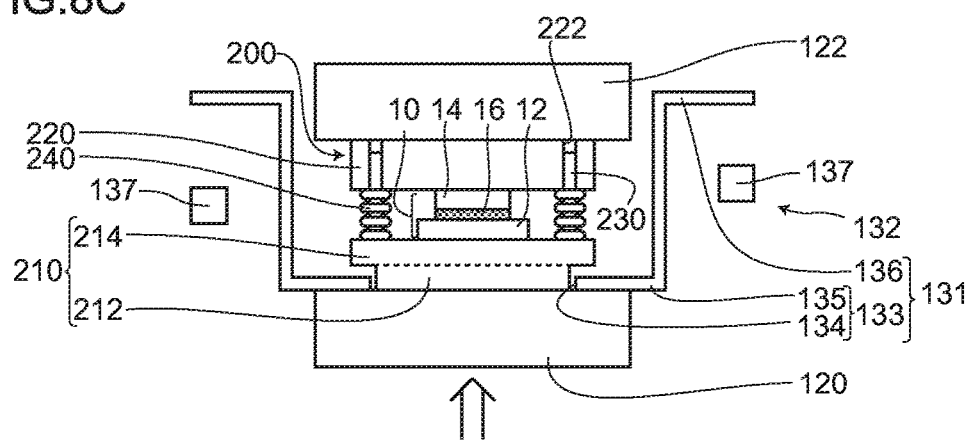
Figure 9A:
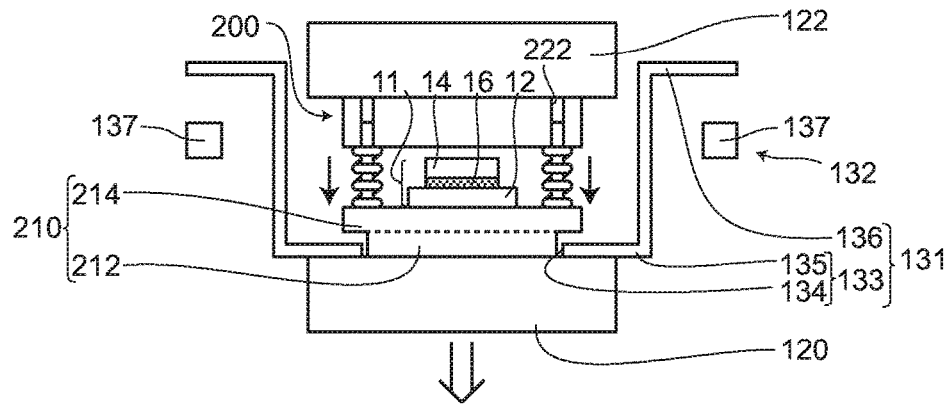
Figure 9B:
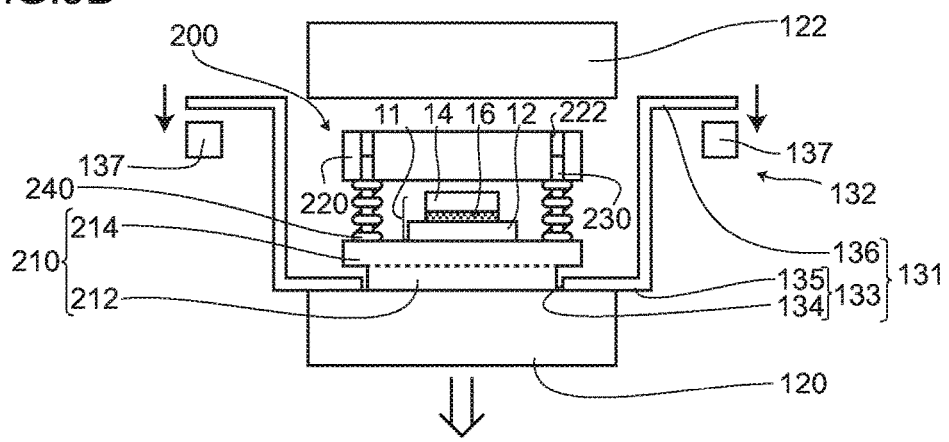
Figure 9C:
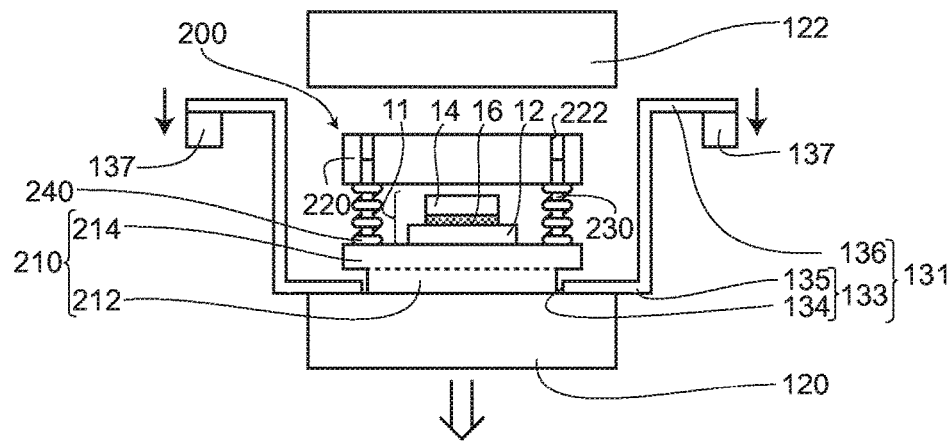

When the first heating plate 120 is further moved upward, the first transfer member 210 and the assembled body 10 are also moved upward, and the upper surface of the electronic part 14 and the second transfer member 220 are brought into contact with each other (see FIG. 8C).

In such a state, by moving the first heating plate 120 more upward as described above, the pressure applying unit 200 is applied with pressure by the first heating plate 120 and the second heating plate 122, and pressure is applied to the assembled body 10 (the metal particle paste 16 of the assembled body 10) by the first heating plate 120 and the second heating plate 122 through the first transfer member 210 and the second transfer member 220. Further, heat is transferred to the metal particle paste 16 of the assembled body 10 by the first heating plate 120 and the second heating plate 122 through the first transfer member 210 and the second transfer member 220.

The assembled body 10 can be heated while applying pressure to the assembled body 10 through the first transfer member 210 and the second transfer member 220 and hence, the metal particle paste 16 can be heated while applying pressure to the metal particle paste 16. As a result, the metal particle paste 16 is baked, and the substrate 12 and the electronic part 14 are bonded to each other thus manufacturing the bonded body 11.

6. Pressure Applying Unit Cooling Step

Figure 10A:
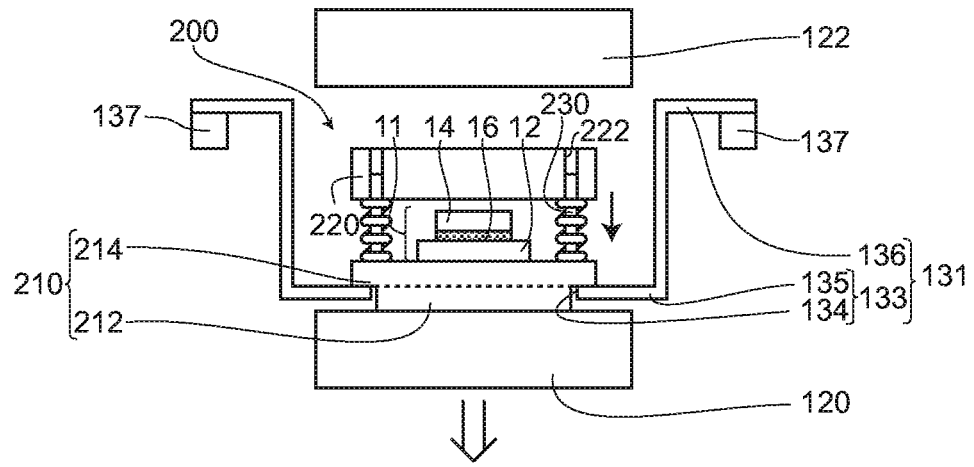
Figure 10B:
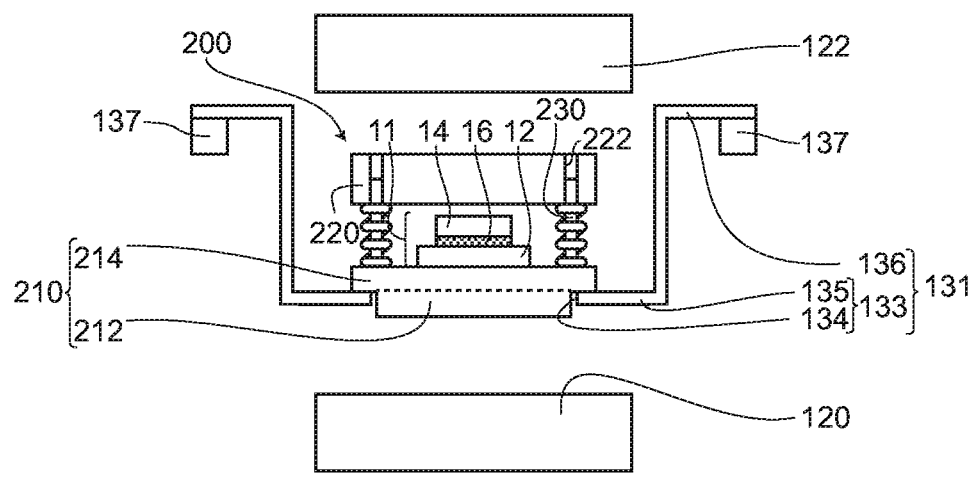

By moving the first heating plate 120 downward after baking the metal particle paste 16, the pressure applying unit 200 and the tray 131 are moved downward (see FIG. 9A to FIG. 9C and FIG. 10A), and the tray 131 which accommodates the pressure applying unit 200 therein and the first heating plate 120 are made to return to respective initial positions (see FIG. 10B). With such an operation, the pressure applying unit 200 is separated from both the first heating plate 120 and the second heating plate 122 and hence, it is possible to cool the pressure applying unit 200.

In this manner, the manufactured bonded body 11 can be taken out to the outside.

Embodiment 3

A method of manufacturing a bonded body according to an embodiment 3 basically includes substantially the same steps as the method of manufacturing a bonded body according to the embodiment 1. However, the method of manufacturing a bonded body according to the embodiment 3 differs from the method of manufacturing a bonded body according to the embodiment 1 with respect to a temperature of a first heating plate and the content of an assembled body arranging step. That is, in the method of manufacturing a bonded body according to the embodiment 3, out of two heating plates, a first heating plate 120 is set to a temperature which falls within a range of from 50° C. to 150° C. (for example, 100° C.), and a second heating plate 122 is set to a temperature which falls within a range of from 250° C. to 350° C. (for example, 300° C.). Further, in the assembled body arranging step, the assembled body 10 is arranged at a position where the assembled body 10 is in contact with the first heating plate 120 (see FIG. 11).

Figure 12:
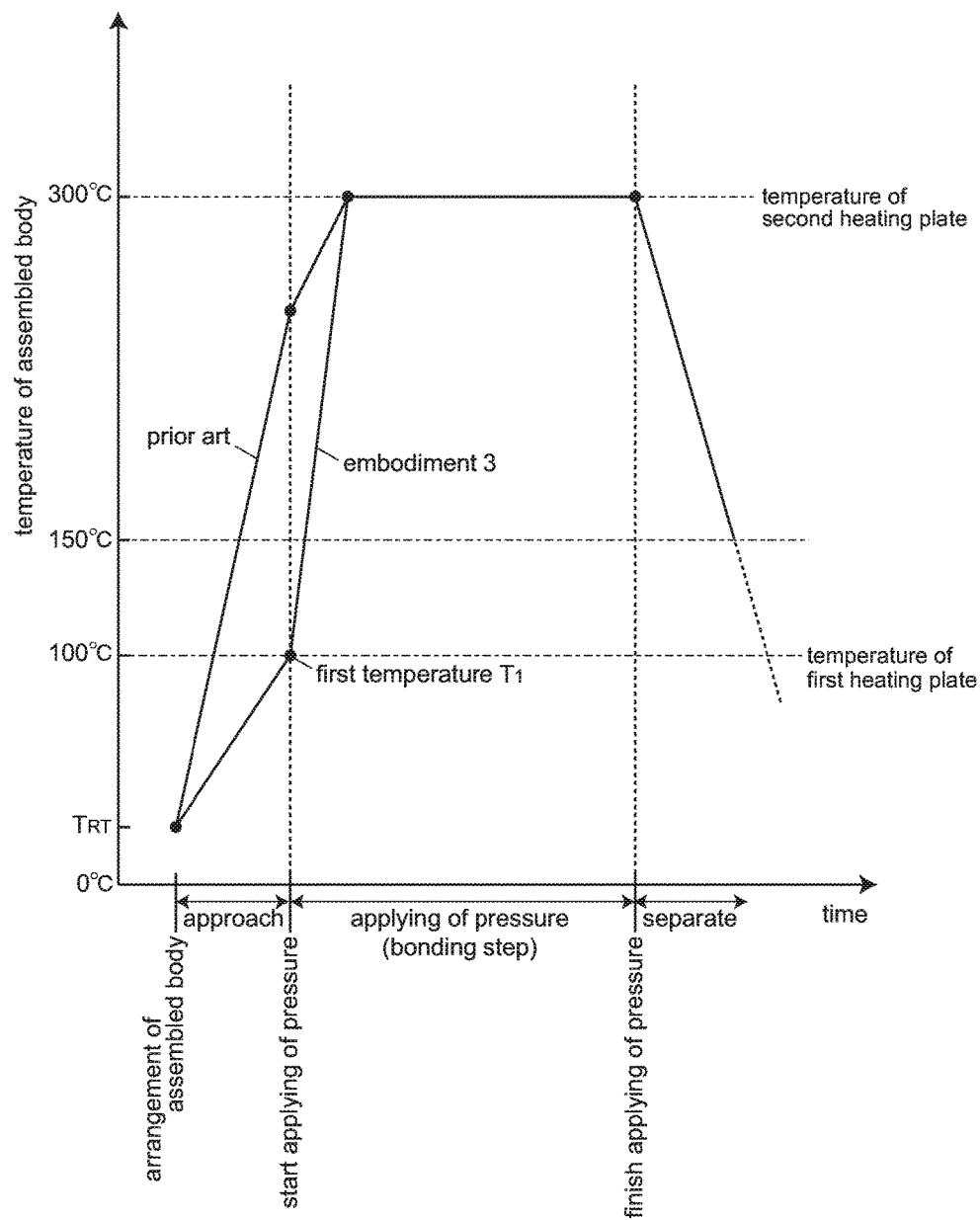
FIG. 12 is a view schematically showing a change in temperature of an assembled body according to the embodiment 3.
Figure 13A:
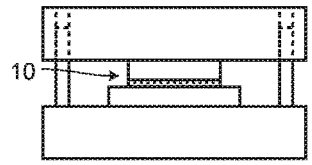
Figure 13B:
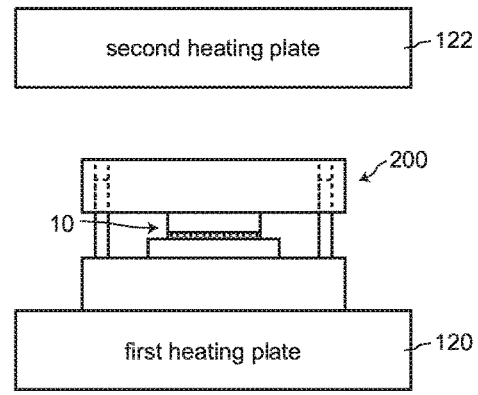
Figure 13C:
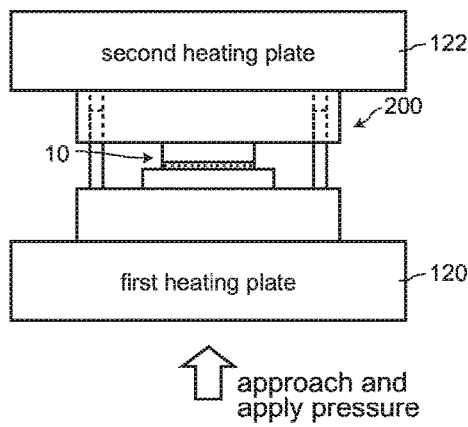
Figure 13D:
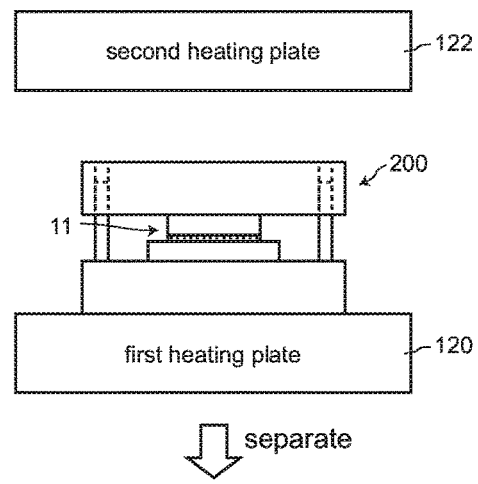
Figure 14A:
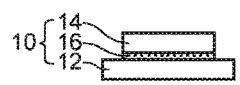
Figure 14A:
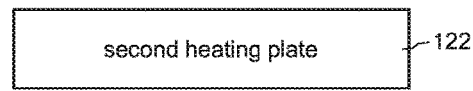
Figure 14B:
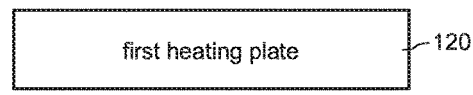
Figure 14C:
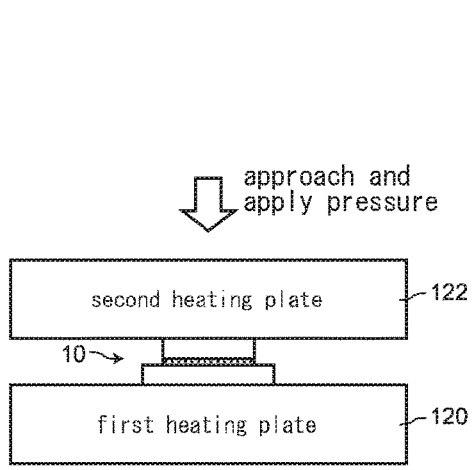
Figure 14D:
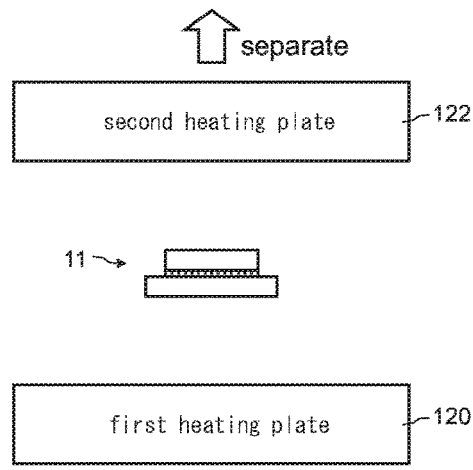
Figure 18A:
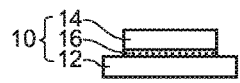
Figure 18B:
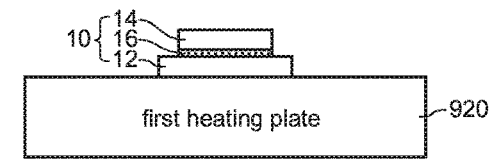
Figure 18C:
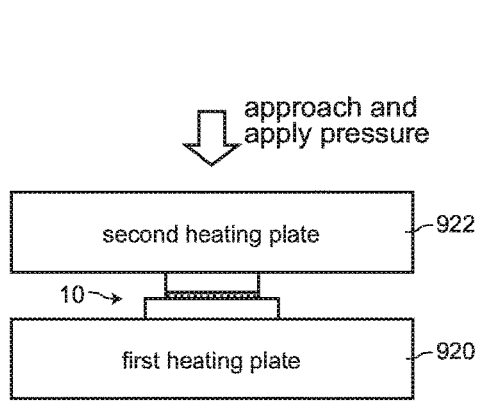
Figure 18D:
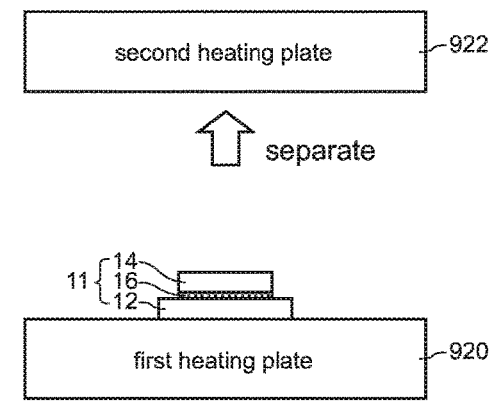

In this manner, the method of manufacturing a bonded body according to the embodiment 3 differs from the method of manufacturing a bonded body according to the embodiment 1 with respect to a temperature of the first heating plate and the content of the assembled body arranging step. However, as described above, out of two heating plates, the first heating plate 120 is set to a temperature which falls within a range of from 50° C. to 150° C. (for example, 100° C.), and the second heating plate 122 is set to a temperature which falls within a range of from 250° C. to 350° C. (for example, 300° C.). Accordingly, the bonding step can be performed under a condition that a temperature $T_1$ of the assembled body at the time of starting applying of pressure to the assembled body 10 (that is, at the time of starting the applying of pressure) by two heating plates (the first heating plate 120, the second heating plate 122) falls within a range of from 0° C. to 150° C. (see a curve of the embodiment 3 in FIG. 12). As a result, in the same manner as the method of manufacturing a bonded body according to the embodiment 1, in the bonding step, a sintering reaction minimally occurs in a metal particle paste before pressure is applied to the assembled body. As a result, a substrate and an electronic part can be bonded to each other with a bonding strength higher than that of the prior art.

Embodiment 4

A method of manufacturing a bonded body according to an embodiment 4 basically includes substantially the same steps as the method of manufacturing a bonded body according to the embodiment 2. However, the method of manufacturing a bonded body according to the embodiment 4 differs from the method of manufacturing a bonded body according to the embodiment 2 with respect to the content of a pressure applying unit arranging step. That is, in the method of manufacturing a bonded body according to the embodiment 4, in the pressure applying unit arranging step, a pressure applying unit 200 is directly mounted on a first heating plate 120 (see FIG. 13).

As described above, the method of manufacturing a bonded body according to the embodiment 4 differs from the method of manufacturing a bonded body according to the embodiment 2 with respect to the content of the pressure applying unit arranging step. However, in the same manner as the case of the method of manufacturing a bonded body according to the embodiment 2, a substrate and an electronic part are not bonded to each other by heating the assembled body while directly applying pressure to the assembled body using two heating plates but are bonded to each other by heating while indirectly applying pressure to the assembled body using a pressure applying unit. Accordingly, even when both temperatures of two heating plates (a first heating plate 120, a second heating plate 122) are 300° C., a bonding step can be performed under a condition that a temperature $T_1$ of the assembled body at the time of starting applying of pressure to the assembled body 10 (that is, at the time of starting the applying of pressure) by two heating plates (the first heating plate 120, the second heating plate 122) falls within a range of from 0° C. to 150° C. As a result, in the same manner as the case of the method of manufacturing a bonded body according to the embodiment 2, in the bonding step, a sintering reaction minimally occurs in a metal particle paste before pressure is applied to the assembled body. As a result, the substrate and the electronic part can be bonded to each other with a bonding strength higher than that of the prior art.

Although the present invention has been explained heretofore by reference to the above-mentioned embodiments, the present invention is not limited to the above-mentioned embodiments. Various modifications are conceivable without departing from the gist of the present invention. For example, following modifications are also conceivable.

(1) The number, materials, shapes, positions, sizes and the like of the constitutional elements described in the above-mentioned embodiments are merely examples, and can be changed within a range where advantageous effects of the present invention are not impaired.

(2) In the above-mentioned embodiment 1, the substrate 12 and the electronic part 14 are bonded to each other by heating while applying pressure to the assembled body 10 by moving the first heating plate 120 upward. However, the present invention is not limited to such a configuration. As shown in FIG. 14, the substrate 12 and the electronic part 14 may be bonded to each other by heating while applying pressure to the assembled body 10 by moving the second heating plate 122 downward (modification 1). As shown in FIG. 15, the substrate 12 and the electronic part 14 may be bonded to each other by heating while applying pressure to the assembled body 10 by moving the first heating plate 120 upward and by moving the second heating plate 122 downward (modification 2). As shown in FIG. 16, the substrate 12 and the electronic part 14 may be bonded to each other by heating while applying pressure to the assembled body 10 by moving the first heating plate 120 and/or the second heating plate 122 in the transverse direction (modification 3).

(3) In the present invention, as shown in FIG. 17, in the assembled body arranging step, in a state where two heat shielding plates (a first heat shielding plate 150, a second heat shielding plate 152) are arranged at a position in a space defined between two heating plates (a first heating plate 120, a second heating plate 122) where two heat shielding plates (the first heat shielding plate 150, the second heat shielding plate 152) are brought into contact with neither one of two heating plates (the first heating plate 120, the second heating plate 122), the assembled body 10 may be arranged in a space defined between two heat shielding plates (the first heat shielding plate 150, the second heat shielding plate 152) at a position where the assembled body 10 is in contact with neither one of two heat shielding plates (the first heat shielding plate 150, the second heat shielding plate 152). Further, in the bonding step, at least one of two heating plates (the first heating plate 120, the second heating plate 122) may be moved toward the other of two heating plates after two heat shielding plates (the first heat shielding plate 150, the second heat shielding plate 152) are retracted from the space defined between two heating plates (the first heating plate 120, the second heating plate 122).

REFERENCE SIGNS LIST

10: assembled body
11: bonded body
12: substrate
14: electronic part
16: metal particle paste
120: first heating plate
122: second heating plate
131: tray
132: positioning portion
133: bottom surface
134: opening portion
135: support portion
136: folded portion (of tray)
137: tray receiving portion
150, 152: heat shielding plate
200: pressure applying unit
210: first transfer member
212: base portion
214: shoulder portion
220: second transfer member
222: guide member receiving hole
230: guide member
240: distance adjusting mechanism

The invention claimed is:

1. A method of manufacturing a bonded body having a structure where a substrate and an electronic part are bonded to each other with a metal particle paste interposed therebetween, the method comprising:
   an assembled body forming step of forming an assembled body where the electronic part is mounted on the substrate with the metal particle paste interposed therebetween;
   an assembled body arranging step of arranging the assembled body between two heating plates arranged in an opposedly facing manner; and
   a bonding step of bonding the substrate and the electronic part to each other by heating while applying pressure to the assembled body by moving at least one of said two heating plates to the other of said two heating plates, wherein:
   the bonding step is performed under a condition that a temperature of the assembled body at the time of starting applying of the pressure to the assembled body by said two heating plates falls within a range of from 0° C. to 150° C., and
   in the assembled body arranging step, the assembled body is arranged in a space defined between said two heating plates at a position where the assembled body is in physical contact with neither one of said two heating plates, and
   in the bonding step, at least one of said two heating plates starts to move with the assembled body being arranged in a space defined between said two heating plates at a position where the assembled body is in physical contact with neither one of said two heating plates,
   wherein the method of manufacturing a bonded body further comprises, between the assembled body forming step and the assembled body arranging step, a pressure applying unit forming step for forming a pressure applying unit where the assembled body is sandwiched between two transfer members which transfer pressure and heat, and
   in the assembled body arranging step, the pressure applying unit is arranged in a space defined between said two heating plates at a position where the pressure applying unit is in physical contact with neither one of said two heating plates.

2. A method of manufacturing a bonded body having a structure where a substrate and an electronic part are bonded to each other with a metal particle paste interposed therebetween, the method comprising:
   an assembled body forming step of forming an assembled body where the electronic part is mounted on the substrate with the metal particle paste interposed therebetween;
   an assembled body arranging step of arranging the assembled body between two heating plates arranged in an opposedly facing manner; and
   a bonding step of bonding the substrate and the electronic part to each other by heating while applying pressure to the assembled body by moving at least one of said two heating plates to the other of said two heating plates, wherein:
   the bonding step is performed under a condition that a temperature of the assembled body at the time of starting applying of the pressure to the assembled body by said two heating plates falls within a range of from 0° C. to 150° C., and
   in the assembled body arranging step, the assembled body is arranged in a space defined between said two heating plates at a position where the assembled body is in physical contact with neither one of said two heating plates, and
   in the bonding step, at least one of said two heating plates starts to move with the assembled body being arranged in a space defined between said two heating plates at a position where the assembled body is in physical contact with neither one of said two heating plates.

3. A method of manufacturing a bonded body having a structure where a substrate and an electronic part are bonded to each other with a metal particle paste interposed therebetween, the method comprising:
   an assembled body forming step of forming an assembled body where the electronic part is mounted on the substrate with the metal particle paste interposed therebetween;
   an assembled body arranging step of arranging the assembled body between two heating plates arranged in an opposedly facing manner; and
   a bonding step of bonding the substrate and the electronic part to each other by heating while applying pressure to the assembled body by moving at least one of said two heating plates to the other of said two heating plates, wherein:

the bonding step is performed under a condition that a temperature of the assembled body at the time of starting applying of the pressure to the assembled body by said two heating plates falls within a range of from 0° C. to 150° C., and in the assembled body arranging step, the assembled body is arranged in a space defined between said two heating plates at a position where the assembled body is not in physical contact with either of said two heating plates, and in the bonding step, at least one of said two heating plates starts to move with the assembled body being arranged in a space defined between said two heating plates at a position where the assembled body is in physical contact with neither one of said two heating plates.

4. The method of manufacturing a bonded body according to claim 2, wherein the bonding step is performed under a condition that the temperature of the assembled body at the time of starting applying of the pressure to the assembled body by said two heating plates falls within a range of from 50° C. to 135° C.

5. The method of manufacturing a bonded body according to claim 2, wherein, in the assembled body arranging step, in a state where two heat shielding plates are arranged at a position in a space defined between said two heating plates where said two heat shielding plates are brought into physical contact with neither one of said two heating plates, the assembled body is arranged in a space defined between said two heat shielding plates at a position where the assembled body is in physical contact with neither one of two heat shielding plates, and in the bonding step, at least one of said two heating plates is moved toward the other of said two heating plates after said two heat shielding plates are retracted from the space defined between said two heating plates.

\* \* \* \* \*